United States Patent [19]

Koishi et al.

[11] Patent Number: 4,701,609
[45] Date of Patent: Oct. 20, 1987

[54] SEMICONDUCTOR LASER DRIVE CIRCUIT WITH PEAK DETECTION AND CONTROL

[75] Inventors: Kenji Koishi, Hyogo; Tamotsu Matsuo, Osaka, both of Japan

[73] Assignee: Matsushita Electric Industrial Co. Ltd., Osaka, Japan

[21] Appl. No.: 758,807

[22] Filed: Jul. 25, 1985

[30] Foreign Application Priority Data

Jul. 27, 1984 [JP] Japan .................. 59-157805

[51] Int. Cl.⁴ .............................. G01V 1/32
[52] U.S. Cl. ................... 250/205; 250/214 C; 369/116
[58] Field of Search ............. 250/205, 206, 214 R, 250/214 C; 372/25, 29, 30, 38; 369/54, 106, 116, 121, 122

[56] References Cited

U.S. PATENT DOCUMENTS

| | | | |
|---|---|---|---|
| 4,507,767 | 3/1985 | Takasugi | 369/116 |
| 4,523,089 | 6/1985 | Maeda et al. | 250/205 |
| 4,562,567 | 12/1985 | Frankfort et al. | 369/116 |
| 4,598,198 | 7/1986 | Fayfield | 250/205 |

Primary Examiner—David C. Nelms
Attorney, Agent, or Firm—Spencer & Frank

[57] ABSTRACT

A semiconductor laser drive circuit functioning as a light source of an optical recording/reproducing apparatus using an optical disk. In the recording mode, the input light of a semiconductor laser is modulated by a recording signal, the output light of the semiconductor laser is detected as a monitor signal by a photo sensitive device, the peak value of this monitor signal is held by a peak-hold circuit, a differential compensation control signal is obtained from the output of the peak-hold circuit and is fed back, and a photo control system to control the output light to a constant level is constituted, thereby controlling in such a way that the output light of the semiconductor laser becomes a certain constant modulation amplitude. Even upon recording, the output light can be stably controlled within a wide temperature range even if the characteristic of the semiconductor laser changes with the elapse of time. Also, this drive circuit can be realized by a simple arrangement.

3 Claims, 9 Drawing Figures

SEMICONDUCTOR LASER DRIVE CIRCUIT WITH PEAK DETECTION AND CONTROL

BACKGROUND OF THE INVENTION

A semiconductor laser is used as a light source for recording and reproduction in an optical information recording/reproducing apparatus. Semiconductor lasers have a large variation in light emitting output when there is a change in ambient temperature. In general, the threshold current $I_{th}$ for the light output of a semiconductor laser varies as shown by the following equation in accordance with a change in temperature.

$$I_{th} = (T_j)\alpha \exp(T_j/T_O)$$

$T_0 = 100 \sim 150°$ K.,
$T_j$ (° K.) is the junction temperature of the semiconductor laser.

Therefore, the output light from the semiconductor laser is ordinarily monitored by a photo sensitive device such as a pin diode or the like and is fed back to a drive circuit of the semiconductor laser and a control system is constituted, thereby regulating the output light of the semiconductor laser. In optical information recording/reproducing apparatuses, it is necessary in the recording mode to modulate the output light of the semiconductor laser by a recording signal. However, the level of the output light for recording is a few times larger than the level of the output light for reproduction and also the output light for recording is modulated at a high frequency, so that it is difficult to constitute the control system by feeding back the monitored signal for recording. Therefore, the output light is not modulated by the recording signal, but the voltage of the control system obtained with the output light DC level for reproduction is held and a predetermined output light level which is needed for recording is further added to this held voltage thereby controlling and regulating the output light to stabilize it upon recording.

FIG. 1 shows a practical example. A reference numeral 1 denotes a semiconductor laser; 2 is a pin diode to monitor the output light of the semiconductor laser; 3 an operational amplifier to generate a control voltage for the control system; 4a and 4b transistors to modulate the current caused to flow through the semiconductor laser 1 by a recording signal 5; 6 a variable resistor for allowing a reference voltage to be generated to set the output light for reproduction; and 7a to 7d analog gate switches. Only the switches 7a and 7b are turned on in the reproduction mode, while only the switches 7c and 7d are turned on in the recording mode. Switching between recording and reproduction is performed by controlling the ON/OFF of the analog switches 7a to 7d by a recording gate signal 8. The monitor signal detected by the pin diode 2 is compared with the reference voltage upon reproduction and the control voltage is outputted by the operational amplifier 3. This control voltage is inputted to a sample-hold circuit 9 only for reproduction. Since the analog gate switches 7a and 7b are turned off for recording, the control system for feedback of the monitor signal is disabled. On one hand, the analog gate switches 7c and 7d are turned on and the semiconductor laser is driven using the control voltage which was sampled and held by the sample-hold circuit 9 immediately before the recording. Further, a current source which is constituted by a transistor 10 is enabled to secure the output light level which is needed for recording FIG. 2 shows the relation between the forward current flowing through the semiconductor laser 1 in the arrangement of FIG. 1 and the output light level. $P_P$ indicates the reproducing power level and $P_R$ represents the recording power level. T denotes the ambient temperature of the semiconductor laser. ① is the current value controlled by the feed back of the monitor signal. Even if the ambient temperature changes to T' and the forward current versus output-light level characteristic changes, the current value is controlled to ①'. Therefore, the reproducing power is maintained at a constant level of $P_P$. Upon recording, the current value of ② is added to by the transistor 10 thereby assuring the recording power level $P_R$. The current value of ② to be added is always constant. The above-mentioned light output control method needs a premise such that although the threshold current $I_{th}$ largely varies due to a change in ambient temperature, the gradient of the forward current versus output-light level characteristic, namely, $K = \Delta P_W / \Delta I$ is always constant for the temperature change. However, the gradient K actually largely changes over a wide temperature range so that it cannot be ignored and further the gradient K varies as well due to the time-dependent change of the semiconductor laser.

FIG. 2 shows an operation mode such that when the ambient temperature changes to T', the gradient K changes and the output light level for recording can not be stably controlled. Specifically speaking, the forward current becomes ①' with the change of threshold current $I_{th}'$ and the output light level $P_P$ is secured for reproduction; however, a current value ②' to be added for recording is constant irrespective of the ambient temperature and the current value of ② is also equal. Therefore, the recording power changes from $P_R$ to $P_R'$ and the output light cannot be stably controlled for recording. It is necessary to make the recording bit length small to increase the recording density on the optical disk. In order to secure the signal quality in the reproduced signal of such small recording bits, very stable recording power is required because the signal quality largely depends upon the recording power.

As described above, when considering a wide temperature range and a time-dependent change of the semiconductor laser as well, the semiconductor laser drive circuit which has been conventionally proposed cannot stably control the output light for recording.

The present invention intends to solve the problems in the foregoing conventional example and it is an object of the invention to provide a semiconductor laser drive circuit having a simple arrangement for controlling the output light level so that it remains constant even in the recording mode of modulating the output light of a semiconductor laser by a recording signal.

SUMMARY OF THE INVENTION

According to this invention, in the recording mode of modulating the output light of the semiconductor laser by the recording signal, a monitor signal responsive to the output light of the semiconductor laser is directed by a photo sensitive device; this monitor signal is inputted to a peak-hold circuit to hold the peak value of the input signal; a differential compensation control signal is obtained from an output of the peak-hold circuit and is fed back thereby constituting an optical control system; a control is provided such that the output light of the semiconductor laser becomes a certain constant amplitude modulation signal; the output light can be stably controlled over a wide temperature range even if the characteristic of the semiconductor laser changes with the elapse of time; and this semiconductor laser drive circuit can be realized in a simple circuit arrangement.

BRIEF DESCRIPTION OF THE DRAWINGS

The above and other objects and features of the present invention will be more apparent from the following detailed description taken in conjunction with the following accompanying drawings.

DESCRIPTION OF THE PREFERRED EMBODIMENT

Figure 1:
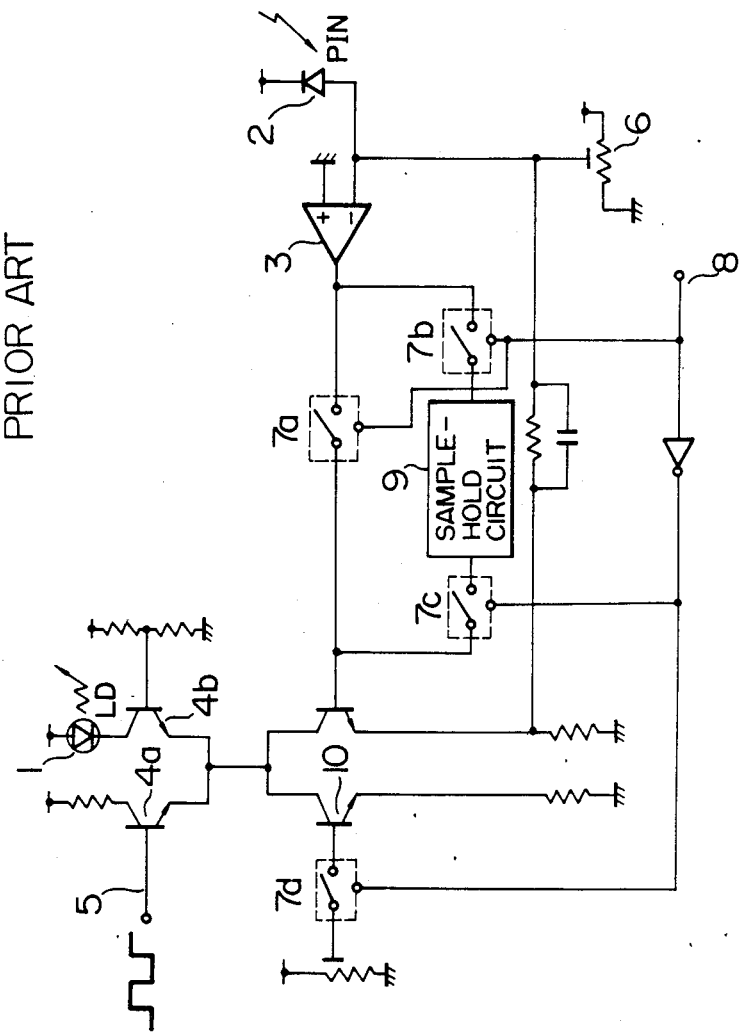
FIG. 1 is a diagram showing an arrangement of a conventional semiconductor laser drive circuit.
Figure 2:
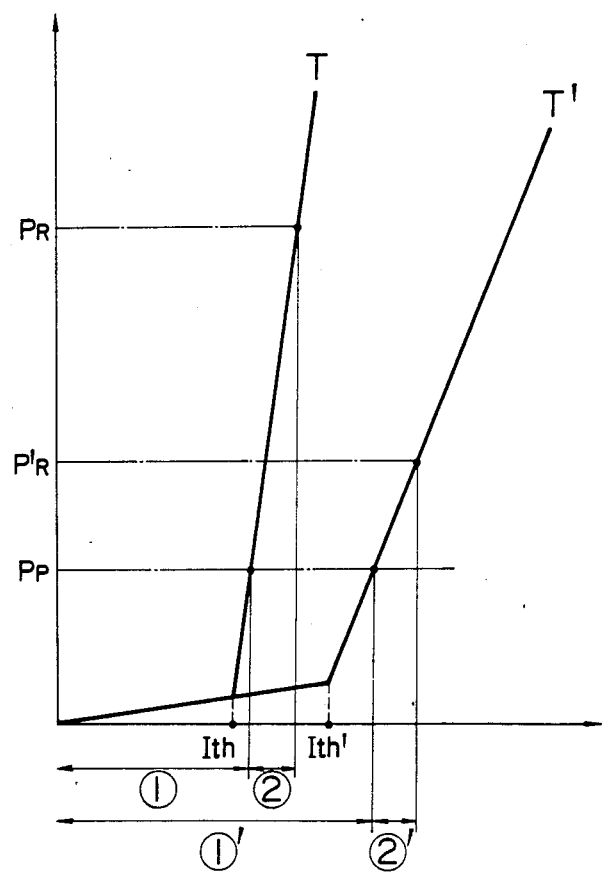
FIG. 2 is a characteristic diagram of the output light level in the conventional example.
Figure 3:
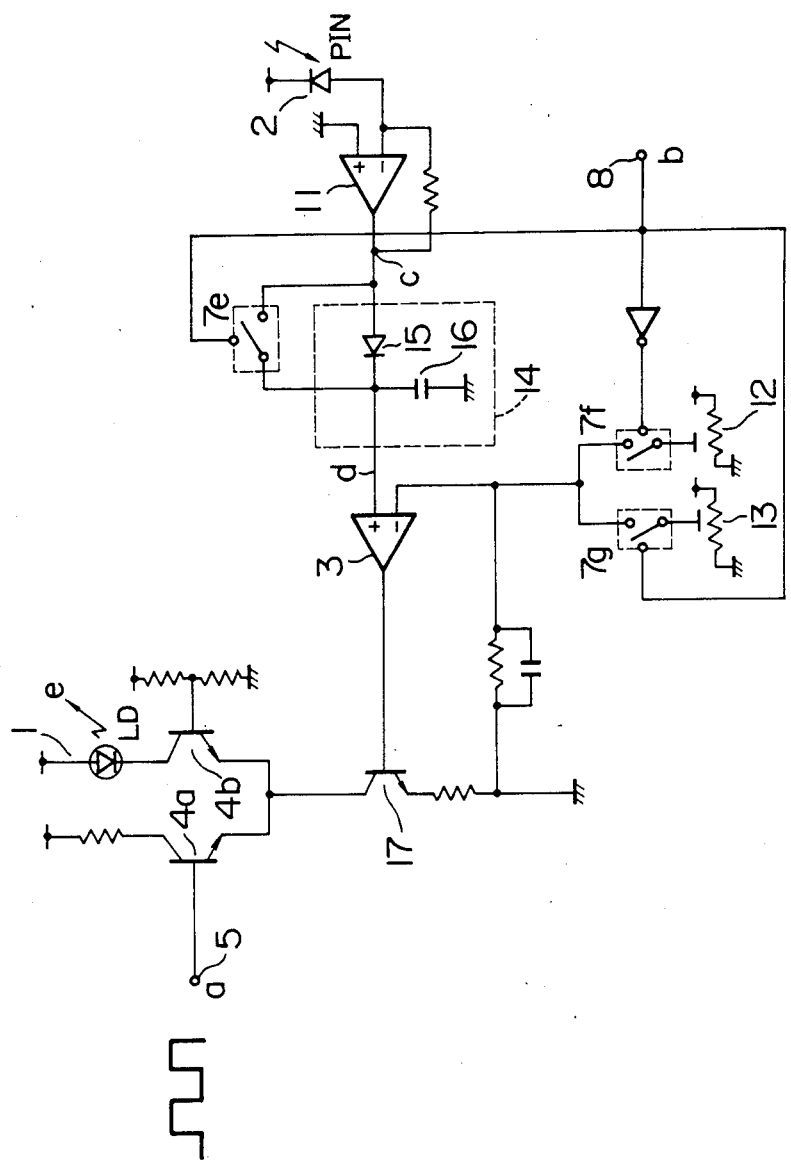
FIG. 3 is a circuit diagram showing an arrangement of a semiconductor laser drive circuit of one embodiment according to the present invention.

FIG. 3 is a diagram showing an arrangement of a semiconductor laser drive circuit in accordance with the present invention. In FIG. 3, parts and components similar to those in the arrangement of the conventional example shown in FIG. 1 are designated by the same reference numerals. FIGS. 4a to 4e are diagrams showing signal wveforms in respective portions of labelled a to e in FIG. 3. First, the control of the light output for the recording mode wherein the output light of the semiconductor laser is modulated by a recording signal will be explained.

Figure 4:
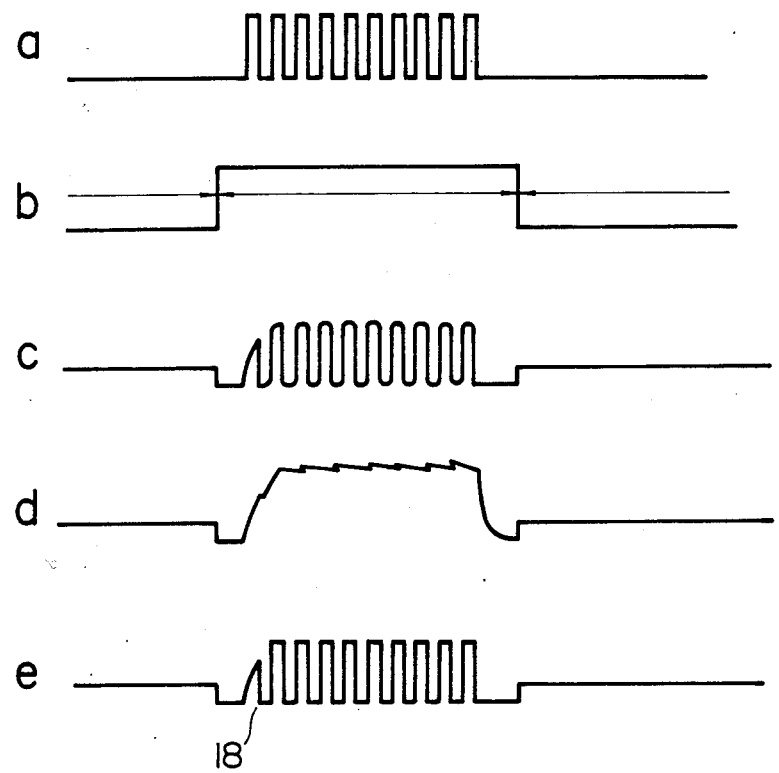
FIGS. 4a, 4b, 4c, 4d and 4e are diagrams showing signal waveforms in respective portions in FIG. 3.

The recording signal a is a pulse signal having frequency components in a frequency band of DC to a few MHz. This recording signal a is inputted from terminal 5 and the current flowing through the semiconductor laser 1 is modulated by the transistors 4a and 4b. The signal waveform of the output light of the semiconductor laser 1 modulated by the recording signal becomes as shown in FIG. 4e. This output light is received by the pin diode 2 arranged in the same casing as that of the semiconductor laser, so that a photo current is generated from the pin diode. The numeral 11 denotes a wideband operational amplifier to convert the current flowing through the pin diode to voltage and then output it. FIG. 4c shows the output waveform of the amplifier 11. Only an analog gate switch 7f is turned on in the recording mode. The numeral 12 identified a variable resistor for generating a reference voltage to set the level of the output light of the semiconductor laser 1 in the recording mode; 13 is a variable resistor provided to set the level of the output light of the laser in the reproduction mode; and 14 is a peak-hold circuit which is constituted by a diode 15 and a capacitor 16 in this embodiment.

The output c of the wideband operational amplifier 11 is inputted to the peak-hold circuit 14 and the peak value of the inputted signal waveform modulated by the recording signal is held and then it is outputted from the circuit 14. The output waveform of the circuit is shown in FIG. 4d. The outputted peak value is proportional to the peak value of the modulation signal amplitude upon recording, namely, to the change in light output level in the recording mode. Therefore, by use of the output signal d of the peak-hold circuit 14 as a differential compensation control voltage of the control system, the peak value of the modulation amplitude upon recording, that is, the light output level upon recording can be stably controlled. It is generally difficult to detect by a photo sensitive device the light output of a semiconductor laser modulated by a recording signal having wideband signal components of DC to a few MHz and to use this detection signal as such a differential compensation signal of the control system. This is because the control system must be constituted with a frequency characteristic responsive to the wideband differential control signal of DC to a few MHz. Even if such a control system is constituted, the circuit arrangement will become complicated and also it is remarkably likely to induce oscillations or the like in the control loop with the result of unstable control. However, by holding only the peak value of the detection signal and using this held voltage as the differential control voltage, it is sufficient for the frequency characteristic of the resulting control system to consider only the transient time through which the output light level of the semiconductor laser 1 is stabilized upon switching between recording and reproduction. The object can be sufficiently attained by constituting a control system having a gain crossover frequency of the order of about tens of kHz.

The operational amplifier 3 in the control loop outputs the control voltage using the output signal d of the peak-hold circuit 14 as the differential signal. The current source to drive the semiconductor laser 1 is constituted by this control voltage and a transistor 17. The light output level upon recording can be stably controlled by modulating the current source having the current value whose peak value was controlled, by the recording signal. The reason why the leading pulse 18 of the pulse train of the recording signal as FIG. 4e is not shaped in a perfect square wave is because it depends on the frequency characteristics of the peak-hold circuit 14 and of the control system at the next stage. Since a preamble signal or a synchronous signal train which is necessary for reproduction of a clock is arranged in the leading portion of the recording signal, even if such a light-output responsive characteristic as shown in FIG. 4e is presented, the reproduction of the data will not be influenced at all.

FIG. 4b shows the recording gate signal to control the ON/OFF of analog gate switches 7e to 7g. Upon reproduction, it is necessary to control the light output to a constant level that is not modulated by the recording signal. If the peak-hold circuit 14 is also enabled when the operation mode is switched from the recording mode to the reproduction mode, it takes a long period until the output light level is returned from the recording level to the reproduction level due to the time constant of the peak-hold circuit.

To realize a rapid switching from the recording mode to the reproduction mode, the analog gate switch 7e is provided and the output of the wideband operational amplifier 11 is bypassed, and upon reproduction, the peak-value holding state of the peak-hold circuit is released by controlling the recording gate signal. Since the output impedance of the wideband operational amplifier 11 is low, the charge stored in the capacitor 16 rapidly discharges through the analog gate switch 7e. Therefore, in the case of switching from the recording mode to the reproduction mode, the differential control signal which is inputted to the operational amplifier 3 is rapidly switched from the peak value voltage of the peak-hold circuit to the voltage of the DC level for the reproduction mode. As described above, by providing the analog gate switch 7e to bypass the output of the amplifier 11, the control of the light output which is made stable in both the recording and reproduction modes and in which the switching speed is high can be realized by a simple arrangement.

Figure 5:
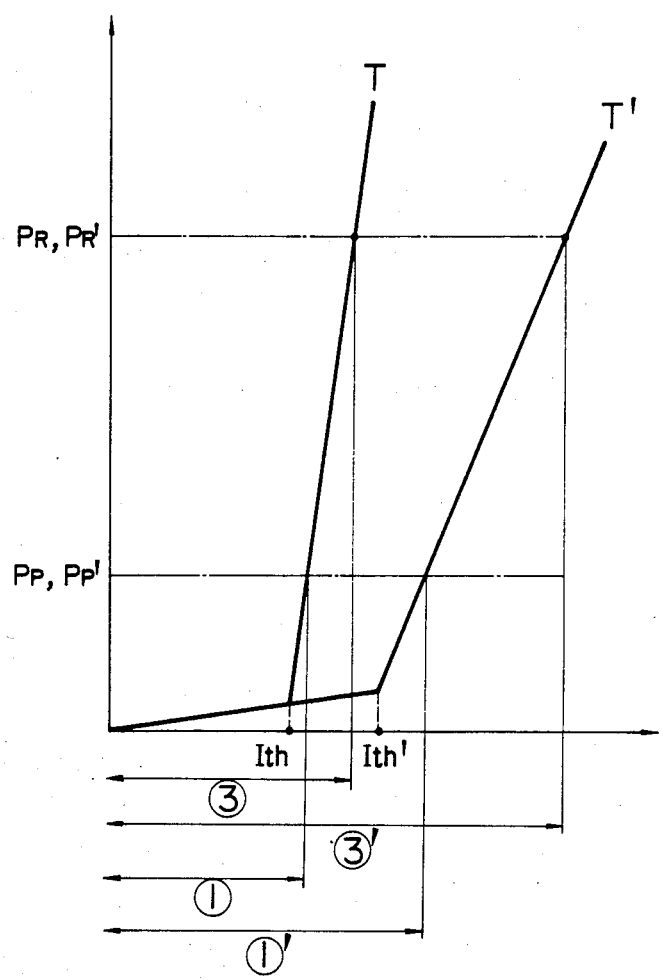
FIG. 5 is a characteristic diagram of the output light level according to the present invention.

FIG. 5 is a diagram showing the characteristic of the light output control in this embodiment. This graph shows the relation between the output light level of the semiconductor laser when the ambient temperature changes from T to T' and the forward current. As will be understood from this graph, in association with the change in ambient temperature of the semiconductor laser, the threshold current changes from $I_{th}$ to $I_{th}'$ and also even if the gradient K changes by a large amount, the output light level is controlled to the output light level of the peak value upon recording. Therefore, by controlling the current value from ③ to ③', the recording power level $P_R$ is constant, that is $P_R$ equals $P_R'$ and the output light is stably controlled. On the contrary, upon reproduction, by releasing the holding state of the peak value by the peak-hold circuit by bypassing due to the analog gate switch 7e, the power level is switched at high speed to the set reproduction power level $P_P'$ thereby resetting the control.

In the semiconductor laser drive circuit of the present invention, upon recording where the output light of the semiconductor laser is modulated by the recording signal, the monitor signal responsive to the output light of the semiconductor laser is detected by the photo sensitive device, this monitor signal is inputted to the peak-hold circuit for holding the peak value of the input signal, the differential control signal is obtained from the output of the peak-hold circuit and is fed back, thereby constituting the optical control system. The control functions such that the output light of the semiconductor laser becomes a certain constant modulation amplitude. Even upon recording as well, the output light can be stably controlled within a wide temperature range even if the characteristic of the semiconductor laser changes with an elapse of time, and also this drive circuit can be realized by a simple arrangement.

We claim:

1. A drive circuit for driving a semiconductor laser having a light output, comprising means for applying a recording signal to said semiconductor laser, the light output of said semiconductor laser being modulated by said recording signal;

a photodetector for receiving the light output of said semiconductor laser, said photodetector generating an output signal corresponding to said light output;

peak holding means coupled to the output of said photodetector for holding, during recording, the peak value of the output signal of said photodetector, said holding means being controlled only by the output of said photodetector; and control means coupled to the output of said holding means for applying, during recording, a control error signal to said semiconductor laser, whereby the light output of said semiconductor laser is amplitude-modulated and has a peak value corresponding to the peak value held by said holding means.

2. A drive circuit for driving a semiconductor laser having a light output, said laser providing a light source for the recording and reproduction of signals, comprising means for applying a recording signal to said semiconductor laser, the light output of said semiconductor laser being modulated by said recording signal;

a photodetector for receiving the light output of said semiconductor laser, said photodetector generating an output signal corresponding to said light output;

peak holding means coupled to the output of said photodetector for holding, during recording, the peak value of the output signal of said photodetector, said holding means being controlled only by the output of said photodetector;

first control means for applying, during recording, a first control error signal to said semiconductor laser, the light output of said semiconductor laser being amplitude-modulated and having a peak value corresponding to the peak value held by said holding means;

bypass means for bypassing and disabling said peak holding means, said bypass means being enabled only during reproduction of signals; and second control means coupled to the output of said photodetector through said bypass means for applying, during reproduction, a second control error signal to said semiconductor laser, the light output of said semiconductor laser being held at a predetermined DC level.

3. A drive circuit according to claim 2, wherein said bypass means comprises a switch for connecting, during reproduction, the output signal of said photodetector to the output of said peak holding means, and wherein said holding means comprises a capacitor and a diode.

* * * * *